United States Patent [19]
Caywood et al.

[11] Patent Number: 5,621,738
[45] Date of Patent: Apr. 15, 1997

[54] METHOD FOR PROGRAMMING FLASH EEPROM DEVICES

[75] Inventors: John Caywood, Sunnyvale; Jagdish Pathak, Los Altos Hills, both of Calif.

[73] Assignee: Eastman Kodak Company, Rochester, N.Y.

[21] Appl. No.: 805,328

[22] Filed: Dec. 10, 1991

[51] Int. Cl.$^6$ .................................................... G11C 29/00
[52] U.S. Cl. ...................... 371/21.4; 395/183.18
[58] Field of Search ................. 371/21.4, 21.1, 371/21.2, 21.3; 365/218, 238.5

[56] References Cited

U.S. PATENT DOCUMENTS

| | | | |
|---|---|---|---|
| 4,253,059 | 2/1981 | Bell et al. | 371/21.4 |
| 4,797,850 | 1/1989 | Amitai | 364/900 |
| 4,860,261 | 8/1989 | Kreifels et al. | 365/218 |
| 4,891,791 | 1/1990 | Iijima | 365/189.01 |
| 5,077,738 | 12/1991 | Larsen et al. | 371/15.1 |
| 5,109,361 | 4/1992 | Yim et al. | 365/218 |

OTHER PUBLICATIONS

IEEE International Solid–State Circuits Conference Digest of Technical Papers, Feb. 1989, "A 90ns 100K Erase/Program Cycle Megabit Flash Memory", Virgil Niles Kynett et al., pp. 6–395 through 6–398.

IEEE Spectrum, "Flash memories: the best of two worlds", Dec. 1989, Richard D. Pashley et al., pp. 6–402 through 6–405.

Intel Report, "28F020 2048K (256K×8) CMOS Flash Memory", Nov. 1990, pp. 6–81 through 6–108.

*Primary Examiner*—Robert W. Beausoliel, Jr.
*Assistant Examiner*—Ly V. Hua
*Attorney, Agent, or Firm*—David M. Woods

[57] ABSTRACT

An improved method of programming flash EEPROM devices is provided, wherein the time required to write a plurality of data bytes to a flash EEPROM device with verification is substantially reduced. The disclosed method significantly reduces the effects of the settling times on the overall program-verification cycle by performing row verification of the programmed data bytes instead of the byte verification associated with conventional verification operations.

2 Claims, 4 Drawing Sheets

METHOD FOR PROGRAMMING FLASH EEPROM DEVICES

FIELD OF THE INVENTION

The invention is related generally to methods of storing and verifying data in a semiconductor memory device. More specifically, the invention is related to an improved method of programming flash EEPROM devices, wherein the time required to write a plurality of data bytes to a flash EEPROM device with verification is substantially reduced.

BACKGROUND

The flash electrically erasable programmable read only memory (EEPROM) was developed in response to a need for a nonvolatile memory device having the low cost attributes of conventional erasable programmable read only memories (EPROMs) and the high speed in-system erasure capability of more expensive conventional EEPROMs. Flash EEPROMs are erased electrically, like EEPROMs, but the erasure operation, like EPROMs, is generally accomplished in a bulk or section format. Thus, the flash EEPROM includes the erase speed of the EEPROM while retaining a simpler structure that permits the higher densities and lower costs of the EPROM.

Flash EEPROMs have become particularly useful in electronic still camera imaging applications, in which a large amount of image data for a plurality of images must be stored in a manner that permits easy retrieval and erasure of data for a selected image. Early efforts to produce compact still electronic imaging cameras focused on the use of a magnetic disc drive units to store digital image information. The magnetic disc drive units, however, suffered from a number of deficiencies—including mechanical failures and excessive power requirements—when utilized in still electronic camera systems. With the recent availability of lower priced flash EEPROMs, electronic camera designers have replaced the magnetic disc drive units with semiconductor memory cards that contain a plurality of flash EEPROMs. The memory capacity of the semiconductor memory cards is generally sufficient to permit a plurality of images to be stored, while the in-system erase capability of the flash EEPROMs permits the user to selectively erase one or more of the stored images as desired.

In many applications, such as digital imaging, it is desirable to minimize the amount of time required to write data to the flash EEPROM device while providing verification that the data has been properly written. For example, a write with verification operation, or program-verification operation, is accomplished in a 28F010 CMOS Flash Memory available from INTEL Corporation by having a microprocessor write a command code into a command register of the flash memory after a data byte has been written. The write command code terminates programming operations and causes an internally-generated margin voltage to be applied to the written data byte. The programmed data byte is then read by the microprocessor and compared with the original data byte to determine whether the write operation was successful.

A verification operation is performed after the programming of each data byte, i.e. "byte verification", whether random or sequential data bytes are written to the flash memory. The actual programming operation takes about ten microseconds and the verification operation takes six microseconds. Thus, the verification operation uses a substantial portion of the time required to complete the program-verification cycle for each data byte, and adds considerably to the total amount of time required to completely program the flash EEPROM memory. The invention is directed to significantly reducing the amount of time required to programming a flash EEPROM memory while maintaining the verification operation.

SUMMARY OF THE INVENTION

The invention provides an improved method of programming flash EEPROM devices, wherein the time required to write a plurality of data bytes to a flash EEPROM device with verification is substantially reduced. The invention is based on the recognition that the majority of the time required for the verification operation is attributable to settling times associated with various internal voltages that are changed from program values to verification values during the verification operation. The invention significantly reduces the effects of the settling times on the overall program-verification cycle by performing row verification of the programmed data bytes instead of the byte verification associated with conventional verification operations.

BRIEF DESCRIPTION OF THE DRAWINGS

With the above as background, reference should now be made to following detailed description of the preferred embodiment of the invention and the accompanying drawings in which.

DETAILED DESCRIPTION OF THE PREFERRED EMBODIMENTS

Figure 1:
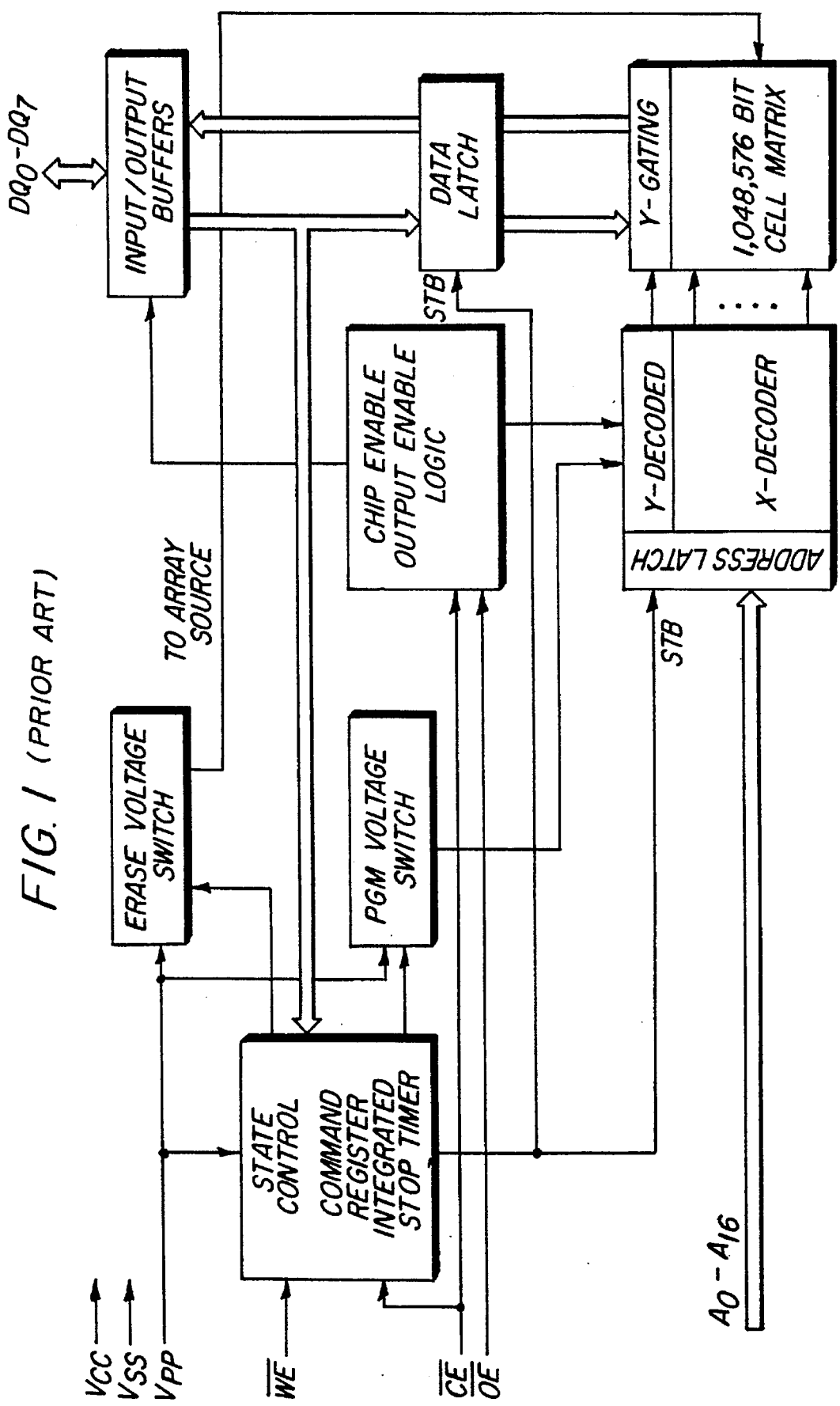
FIG. 1 is a schematic block diagram of an INTEL (Tm) 28F010 Flash Memory device.
Figure 2:
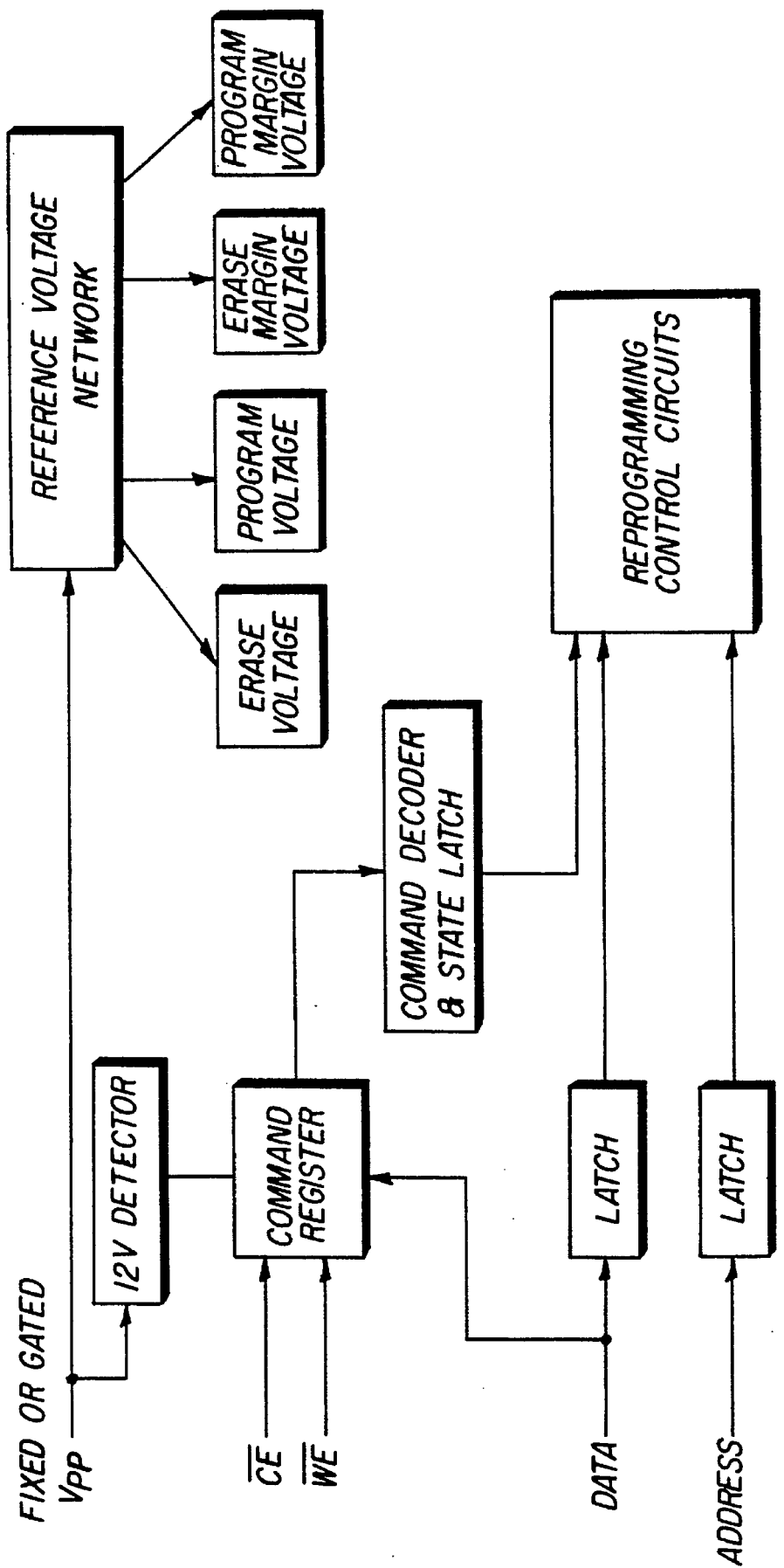
FIG. 2 is a schematic block diagram of the command port of the INTEL (Tm) 28F010 Flash Memory device of FIG. 1.

Schematic block diagrams (as illustrated in INTEL (Tm) Engineering Report ER-24 entitled "The Intel 28F010 Flash Memory" dated October 1990 herein incorporated by reference) of an INTEL (Tm) 28F010 Flash Memory and its command port are respectively provided in FIGS. 1 and 2. The command port simplifies the control of erase, erase verify, program, program verify, and read operations of the flash memory and is activated when a high voltage level (+12) is applied to the Program/Erase Power (Vpp) line and defaults to a read operation, thereby inhibiting the erasure or programming of the flash memory device, when a high voltage level is absent from Vpp. The command port includes a command register, command decoder and state latch, data-in latch, and an address latch. The command decoder output directs the operation of a high voltage erase switch, a program voltage generator, and an erase/program verify voltage generator. Command port functions are controlled by the selection of the chip-enable (CE) and write-enable (WE) lines by a microprocessor (not shown) during a write cycle.

Figure 3:
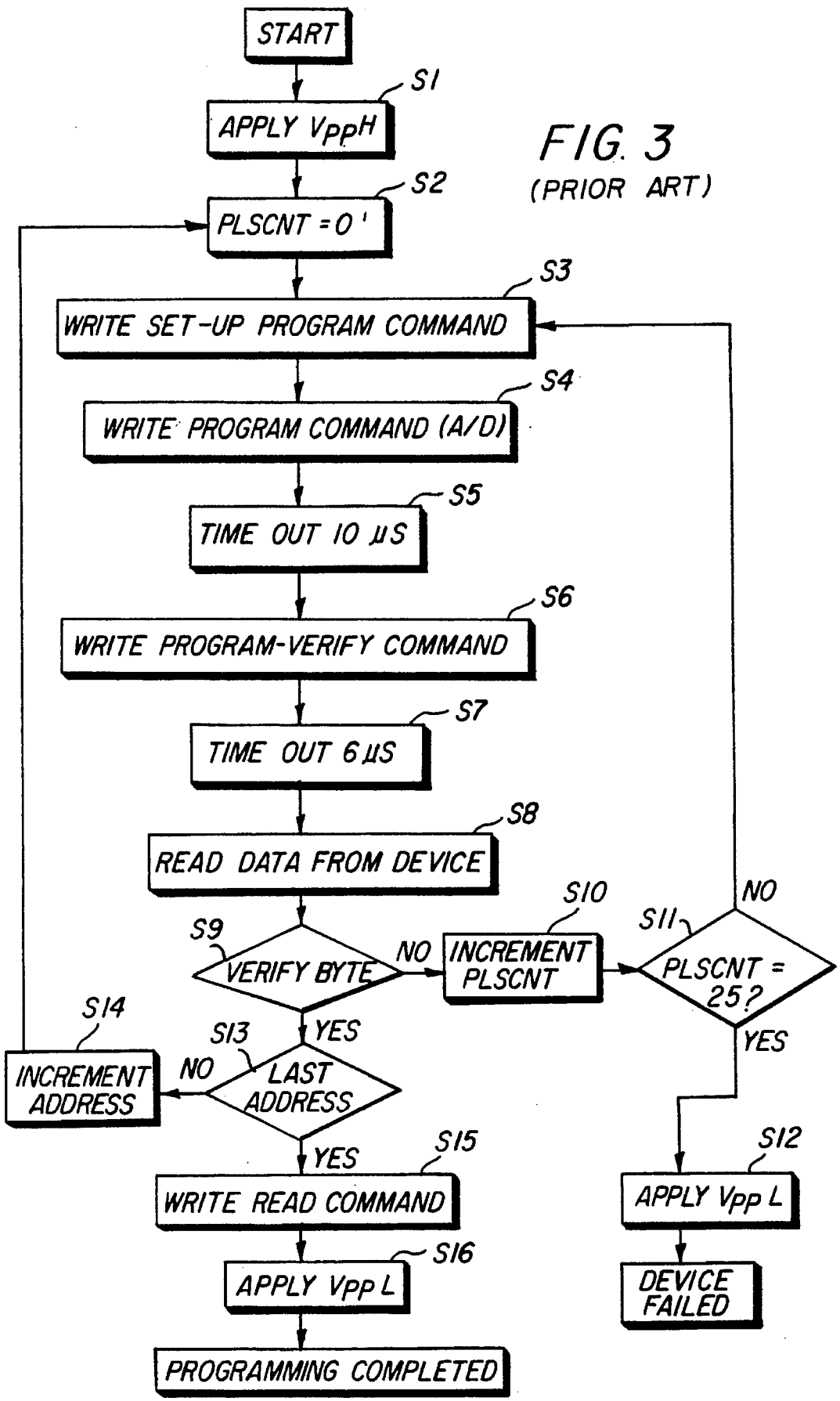
FIG. 3 is a flow diagram of a conventional program-verification operation.

The conventional program-verification process for the illustrated flash memory device is shown in FIG. 3. At step S1, a high voltage level is applied to Vpp. A pulse count value (PLSCNT) is then initialized to zero at step S2. A microprocessor attached to the memory device then sends a write set-up program command to the command port of the memory device at step S3 to set-up programming operations. The write set-up program command is followed by the application of a write program command to write a valid data byte at a specified address in step S4. Ten microseconds are provided for the actual write operation as illustrated in step S5. At step S6, a write program-verify command is supplied to the command port by the microprocessor. The program-verify command halts programming operation and allows various internal voltages to stabilize for a period of six microseconds, as illustrated in step S7, before the programmed data byte is read from the flash memory device at step S8. At step S9, the microprocessor verifies that the programmed data byte read from the flash memory device is equivalent to the original data byte supplied by the microprocessor during the write operation. If the verification is not successful, PLSCNT is incremented by one in step S10. At step S11, a decision is made as to whether PLSCNT is equal to twenty-five to determine whether the data byte has been successfully programmed in twenty-five attempts. If the data byte has not been successfully programmed, i.e. PLSCNT= 25, a low voltage is applied to Vpp at step S12 which indicates a programming error. If the verification is successful, a decision is made as to whether the last desired address has been programmed at step S13. The address is incremented at step S14 if additional addresses need to be programmed and the operation is repeated starting at step S2. Once all addresses have been programmed, a write read command is supplied by the microprocessor to the command port to reset the flash memory device for read operations and a low voltage level is supplied to Vpp at steps S15 and S16.

In the above-described byte verification process, every data byte receives a ten microsecond programming pulse followed by a verification cycle that includes a six microsecond time period to allow the internal voltages to stabilize after slewing from the programming level to the verify level. Thus, every program-verification cycle for each byte requires at least sixteen to seventeen microseconds. The byte verification process might be appropriate for data bytes that are randomly written to different rows of the memory device, however, if more than one data byte is to be written to the same row, the time required to perform the verification process can be substantially decreased by performing verification only after all of the data bytes are written to the row, as only one six microsecond time period to permit voltage settling would be required for each row.

Figure 4:
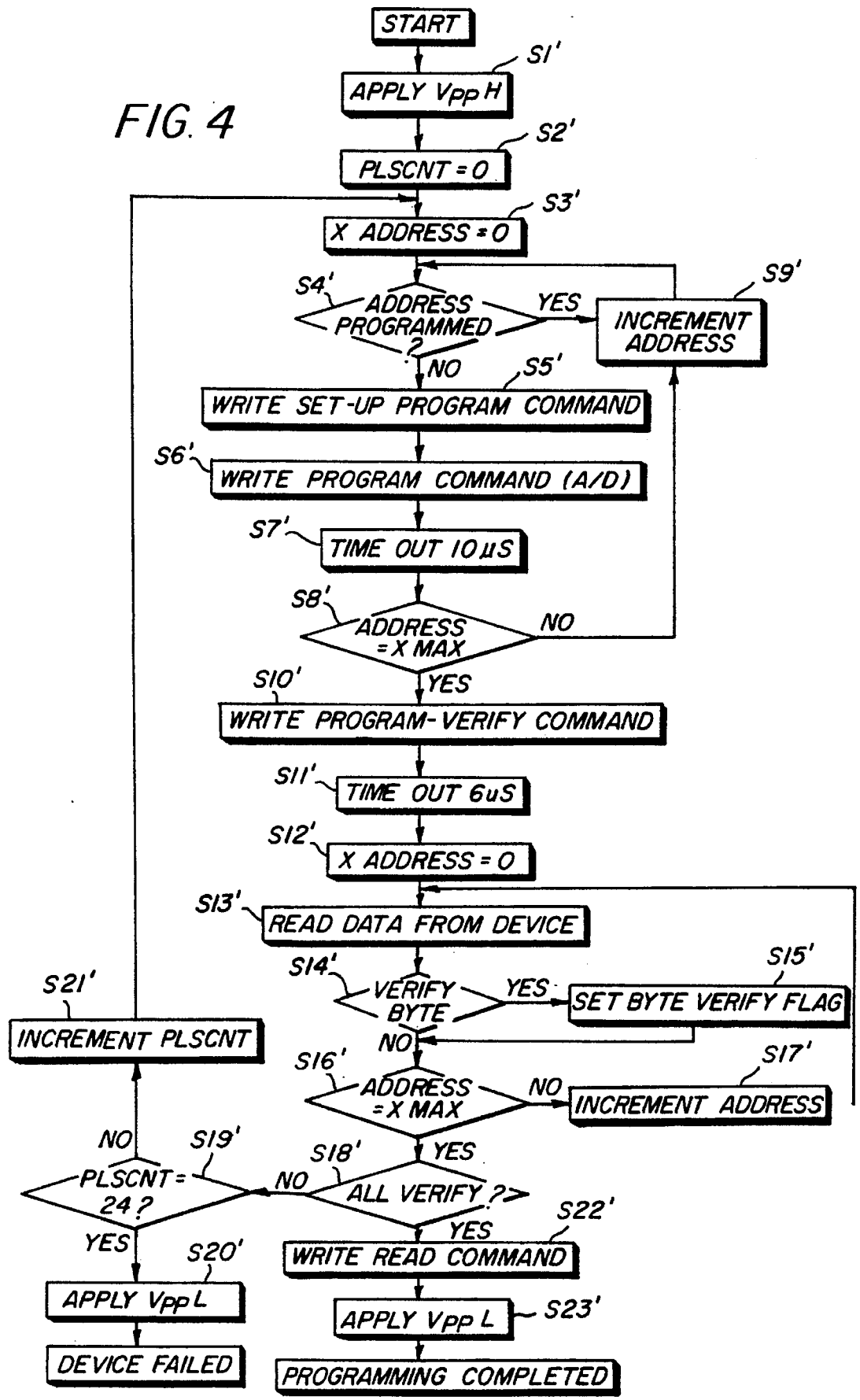
FIG. 4 is a flow diagram of a program-verification operation in accordance with the present invention.

A program-verification process according to the invention is shown in FIG. 4. A high voltage level is applied to Vpp and PLSCNT is initialized at steps Si' and S2'. At step S3', the column address is set to zero. A decision is made at step S4' as to whether the specified address is programmed, i.e., whether a byte verify flag (See step 15') has been set. If not, a write set-up program command, a write program command, and a programming time period of ten microseconds are performed at steps S5'–S7'. A decision is then made as to whether the last column address for the row has been reached in step S8'. If it hasn't, the column address is incremented in step S9' and steps S4'–S8' are repeated. If the last address has been reached, a write program-verify command is supplied by the microprocessor at step S10' and the required six microsecond voltage settling time period is provided at step S11'. The verification process then continues by setting the column address back to zero at step S12', reading the programmed data byte at step S13', verifying the byte at step S14', setting a byte verify flag at step S15' if the programmed data byte is verified as correct, and incrementing the column address at steps S16' and S17' if the last column address has not been reached. At step S18', a decision is made as to whether all of the programmed data bytes have been verified. If all the programmed data bytes are not verified, a decision is made as to whether PLSCNT has reached twenty-four (or any other desired value) at step S19'. If PLSCNT has reached twenty-four, then a low voltage is applied to Vpp at step S20' indicating that programming of the row has failed. If PLSCNT has not reached twenty-four, PLSCNT is incremented at step S21' and the process is repeated starting at step S3'. If all the programmed data bytes do verify at step S18', however, the programming has been successfully completed and a write read command is supplied by the microprocessor at step S22' and a low voltage level is applied to Vpp at step S23'.

In the programming-verification process illustrated in FIG. 4, all bytes in a given row are programmed and then all of the programmed bytes in the row are verified. Programmed bytes which do not verify are given another programming pulse and the verification process is repeated until all bytes are verified or PLSCNT reaches twenty-four. The process is more difficult than the conventional process shown in FIG. 3 and requires two bytes of buffer store for every byte in a row, but is saves time because the six microsecond voltage settling time period is only required once per row instead of after the programming of each byte. For example, in a one megabit memory, a row consists of 128 bytes. Thus, the programming speed can be increased by about 38%, since about six microseconds are eliminated from the conventional byte program-verification process for each byte.

The invention is particularly well suited for use in electronic imaging memory cards, but is applicable to any application in which at least two data bytes are programmed within a given row and to other types of memory devices in which program-verification operations are employed. It will also be understood that the invention has been described with specific reference to a preferred embodiment thereof. It will be understood, however, that modifications and variations are possible within the scope of the appended claims.

What is claimed is:

1. A method of programming a semiconductor memory comprising the steps of: a) selecting a row address of the semiconductor memory to be programmed; b) initializing a column address of the semiconductor memory to be programmed; c) writing a data byte, comprising a plurality of bits, to the selected row and column addresses of the semiconductor memory in a programming mode of operation; d) determining if additional data bytes are to be written to the selected row address; e) incrementing the column address if additional data bytes are to be written to the selected row address; f) switching the operation of the semiconductor memory from a programming mode of operation to a verification mode of operation if additional data bytes are not to be written to the selected row address, providing a predetermined voltage settling time period, and performing a verification operation on the data bytes written to the selected row address, wherein said verification operation is performed after a plurality of sequential data bytes have been written to the selected row address.

2. The method of programming a semiconductor memory as claimed in claim 1 further comprising the step of: g) repeating steps b–f if at least one of the data bytes written to the selected row address does not verify.

* * * * *